(12) United States Patent
Song et al.

(10) Patent No.: US 9,480,194 B2
(45) Date of Patent: Oct. 25, 2016

(54) PICKER ASSEMBLY

(71) Applicant: SAMSUNG ELECTRONICS CO., LTD., Suwon-si, Gyeonggi-do (KR)

(72) Inventors: Jaeho Song, Cheonan-si (KR); Sangin Choi, Asan-si (KR); YoungBin Han, Asan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/666,553

(22) Filed: Mar. 24, 2015

(65) Prior Publication Data

US 2015/0321359 A1    Nov. 12, 2015

(30) Foreign Application Priority Data

May 7, 2014  (KR) .................. 10-2014-0054317

(51) Int. Cl.
| | | |
|---|---|---|
| A47B 97/00 | (2006.01) | |
| B66C 1/02 | (2006.01) | |
| H05K 13/04 | (2006.01) | |
| B25J 15/06 | (2006.01) | |
| H01L 21/677 | (2006.01) | |
| H01L 21/687 | (2006.01) | |
| H01L 23/00 | (2006.01) | |

(52) U.S. Cl.
CPC ....... *H05K 13/0478* (2013.01); *B25J 15/0616* (2013.01); *H01L 21/67706* (2013.01); *H01L 21/687* (2013.01); *H01L 24/00* (2013.01)

(58) Field of Classification Search
CPC .............. B25J 15/0616; H01L 21/67706; H01L 21/687; H01L 21/6838; H01L 24/00; B66C 1/02; B21D 28/243; E05B 65/462; E05B 65/0003; E05B 65/46; E05B 47/0002; E05B 85/24; B65F 1/1615; E05C 19/01; E05C 17/50; E05C 3/162; E05C 3/124; E05F 11/00; H05K 13/0478
USPC ........................................................ 294/65
See application file for complete search history.

(56) References Cited

U.S. PATENT DOCUMENTS

| | | |
|---|---|---|
| 6,173,750 B1 | 1/2001 | Davis et al. |
| 6,364,387 B1 | 4/2002 | Bolotin et al. |
| 6,439,631 B1 | 8/2002 | Kress |
| 6,487,544 B1 | 11/2002 | Eshelman et al. |
| 6,538,244 B1 | 3/2003 | Skunes |
| 7,000,648 B2 * | 2/2006 | Cho ............... G11C 29/56 139/159 |
| 7,150,390 B2 | 12/2006 | Johnson et al. |
| 8,146,969 B2 * | 4/2012 | Yo ................. G01R 31/2893 294/65 |
| 8,240,726 B2 * | 8/2012 | Subotincic ......... B25J 15/0052 198/468.3 |
| 8,376,431 B2 | 2/2013 | Na et al. |

(Continued)

FOREIGN PATENT DOCUMENTS

| | | |
|---|---|---|
| KR | 10-2004-0080936 A | 10/2004 |
| KR | 10-2009-0049063 A | 6/2009 |
| KR | 10-2011-0053616 A | 6/2011 |

*Primary Examiner* — Stephen Vu
(74) *Attorney, Agent, or Firm* — Lee & Morse P.C.

(57) ABSTRACT

A picker assembly includes a picker, a driving member coupled to the picker, the driving member adjusting a position of the picker, a pair of first fixing members on a lower surface of the driving member, the pair of first fixing members being adjacent to a portion at which the driving member and the picker are connected, and a pair of second fixing members on the picker, the pair of second fixing members being coupled to respective first fixing members through latching and fixing.

20 Claims, 6 Drawing Sheets

(56) References Cited

U.S. PATENT DOCUMENTS 8,565,912 B2 10/2013 Wappling et al.
8,594,833 B2* 11/2013 Goodman ............ B65G 47/918
 198/468.3
2004/0146383 A1 7/2004 Behnke
2009/0046921 A1 2/2009 Case et al.
2010/0316478 A1* 12/2010 Na ...................... H01L 21/6838
 414/752.1

* cited by examiner

PICKER ASSEMBLY

CROSS-REFERENCE TO RELATED APPLICATION

Korean Patent Application No. 10-2014-0054317, filed on May 7, 2014, in the Korean Intellectual Property Office, and entitled: "Picker Assembly," is incorporated by reference herein in its entirety.

BACKGROUND

1. Field

The present disclosure herein relates to a picker assembly.

2. Description of the Related Art

A picker is used to pick up and classify semiconductor devices. For example, a picker may pick up semiconductor devices to load or unload onto/from a tray. Also, a picker is provided for a semiconductor device inspection device to transfer semiconductor devices from one tray to another tray or from a tray to a table.

Semiconductor devices have different sizes according to their type. Also, a tray for semiconductor devices may have different spacings for arranging semiconductor devices thereon according to type. Therefore, various kinds of pickers are provided to transfer semiconductor devices to be arranged on trays. Also, an operator needs to install appropriate pickers according to the types of semiconductor devices and trays while performing tasks.

SUMMARY

The present disclosure provides a simple and detachable picker assembly.

Embodiments provide a picker assembly, including a picker, a driving member coupled to the picker, the driving member adjusting a position of the picker, a pair of first fixing members on a lower surface of the driving member, the pair of first fixing members being adjacent to a portion at which the driving member and the picker are connected, and a pair of second fixing members on the picker, the pair of second fixing members being coupled to respective first fixing members through latching and fixing.

Each of the first fixing members may include a fixing body on the lower surface of the driving member, and a latch member coupled to the fixing body, the latch member being movable horizontally.

The fixing body may include an accommodation part with an opening therein, the latch member may include an insertion part accommodated in the accommodation part, and a protruding part extending from the insertion part to an outside of the accommodation part, the protruding part being exposed to the outside of the accommodation part.

The second fixing members may be latched onto the protruding parts of the respective first fixing members.

The picker assembly may further include an elastic member in the accommodation part, the elastic member being between the insertion part and the fixing body.

The picker assembly may further include an operation hole through the fixing body, the insertion part being coupled to an operation part having a rod shape and extending through the operation hole.

The fixing body may have a guide rib on an external surface thereof at a portion that contacts the picker, and the picker may have a guide groove corresponding to the guide rib, the guide groove being on an external surface thereof.

The guide rib and the guide groove may extend along vertical directions.

The picker assembly may further include a coupling protrusion on a surface of one of the picker and the driving member, and an insertion groove on a surface of another of the picker and the driving member, the coupling protrusions being inserted into the insertion groove.

Embodiments also provide a picker assembly, including a picker, a driving member coupled to the picker, the driving member adjusting a position of the picker, a pair of first fixing members on one of the driving member and the picker, the pair of first fixing members being adjacent to a portion at which the driving member and the picker are connected, and a pair of second fixing members on the other of the picker and the driving member, the pair of second fixing members being coupled to the pair of first fixing members through latching and fixing.

Each of the first fixing members may include a fixing body, and a latch member coupled to the fixing body to be movable horizontally.

The latch member may receive force in a direction oriented toward the second fixing member.

The fixing body may include an accommodation part having an opening therein, and the latch member may include an insertion part accommodated in the accommodation part, and a protruding part extending from the insertion part and exposed to an outside of the accommodation part.

Each of the second fixing members may have a latch shape.

The second fixing member may have a latch part at an end portion thereof to protrude in a direction of the latch member.

Embodiments also provide a picker assembly, including a picker, a driving member coupled to the picker, the driving member adjusting a position of the picker, first fixing members on the driving member, a first portion of each of the first fixing member extending from the driving member toward the picker, and second fixing members on the picker, each of the second fixing members including a hook-shaped portion latched onto the first portion of a respective first fixing member.

The first fixing member may include a fixing body on the driving member, and a latch member extending from the fixing member to be exposed to an exterior of the fixing body.

The hook-shaped portion of the second fixing member may be latched onto the latch member of the first fixing member.

The hook-shaped portion of the second fixing member may include a first portion extending horizontally from a side surface of the picker, a second portion extending vertically from the first portion toward the driving member, and a third portion extending from the second portion and curving around a top of the latch member of the first fixing member.

The second portion of the second fixing member nay have a slanted surface facing the latch member of the first fixing member, and the latch member has a slanted surface facing the slanted surface of the second portion of the second fixing member, the two slanted surfaces being complementary.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
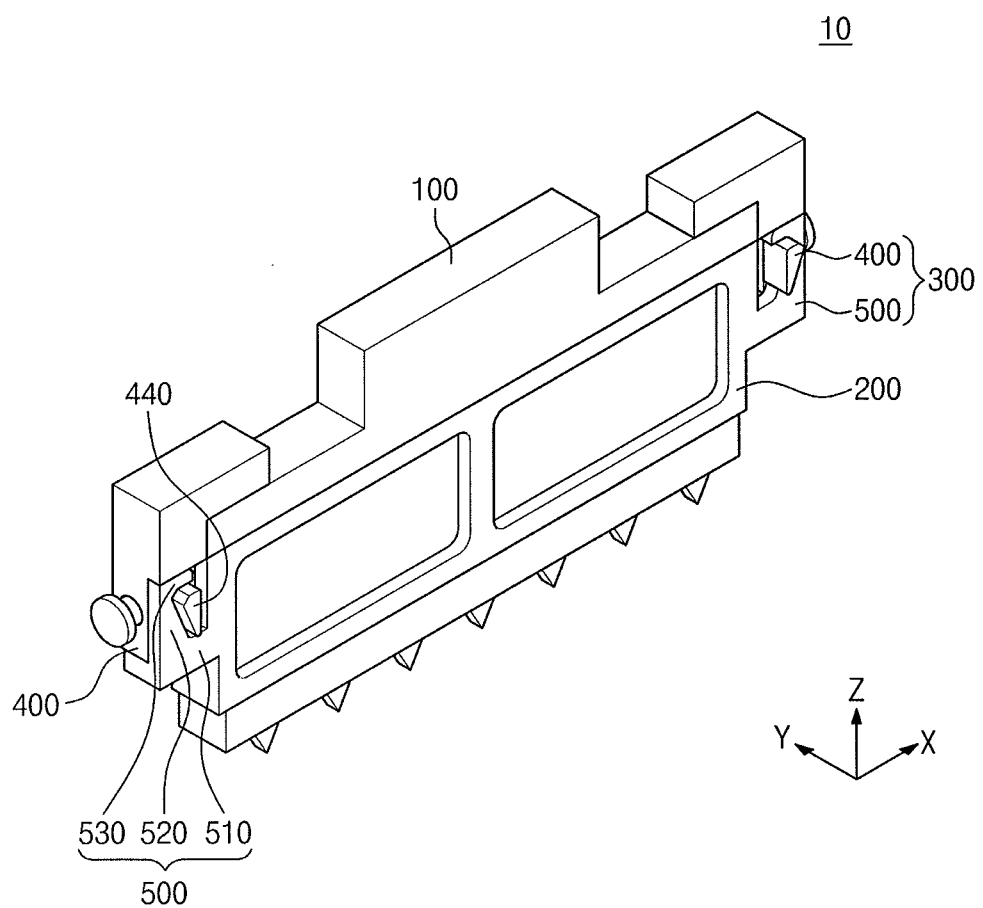
FIG. 1 illustrates a perspective view of a picker assembly according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is a view illustrating a picker assembly according to an embodiment. Referring to FIG. 1, a picker assembly 10 may include a driving member 100, a picker 200, and a detachable unit 300.

The picker assembly 10 may be used to pick up and classify semiconductor devices. The picker assembly 10 transfers semiconductor devices that are in an arranged state from one location to another. At this time, the picker assembly 10 may adjust the spacing between semiconductor devices which are picked up thereby.

A tray may be used to load or transfer semiconductor devices. The tray may load a plurality of semiconductor devices in an arranged state. The picker assembly 10 may be used to load semiconductor devices onto a tray, unload semiconductor devices from a tray, or transfer semiconductor devices from one tray to another tray.

Also, the picker assembly 10 may be used in a semiconductor device inspection device. An inspection may be conducted on a semiconductor device that has undergone a manufacturing process to check whether or not operating characteristics thereof are correctly realized. As mentioned above, the semiconductor inspection device inspects the operating characteristics of the semiconductor device. The picker assembly 10 may be used to carry semiconductor devices into or out of the semiconductor device inspection device. In addition, the picker assembly may be used to move semiconductor devices within the semiconductor device inspection device.

Figure 2:
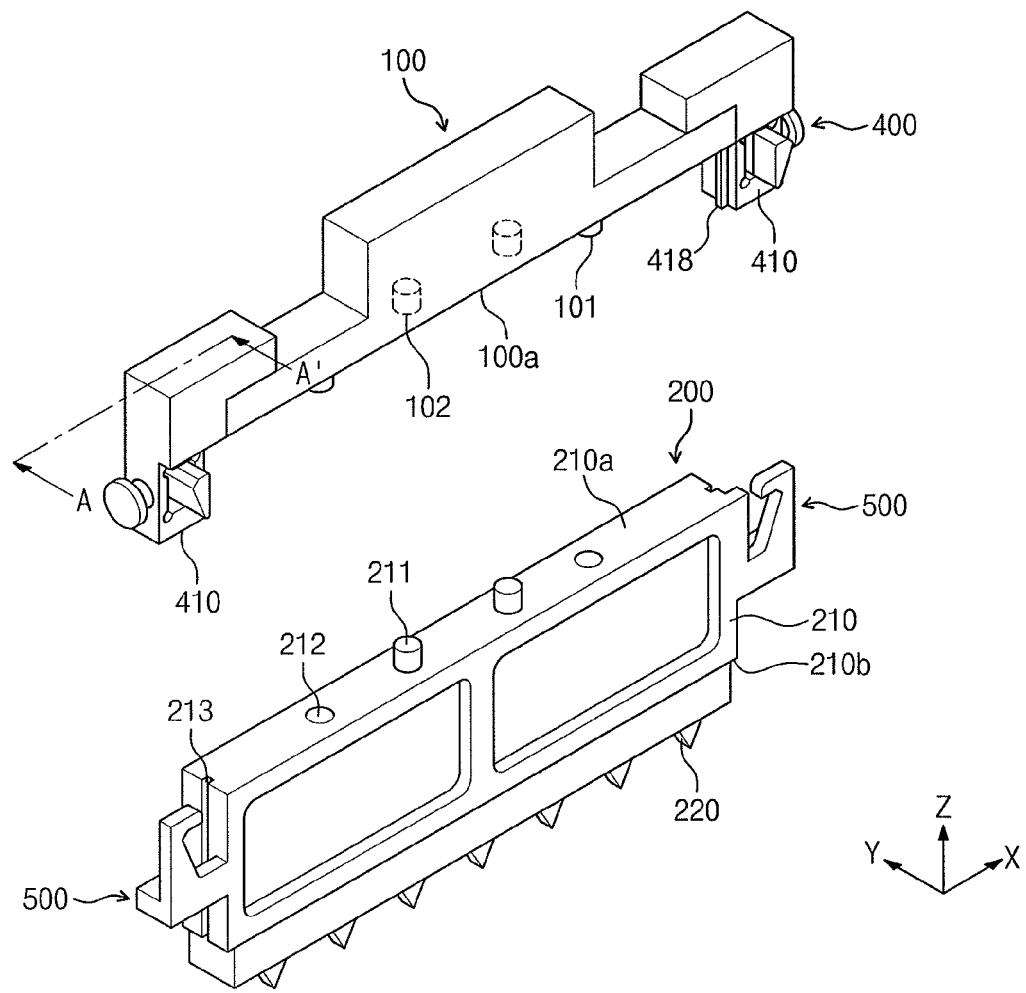
FIG. 2 illustrates an exploded perspective view of the picker assembly in FIG. 1.

FIG. 2 is a view illustrating a picker assembly in which the picker 200 is separated from the driving member 100.

Hereinafter, a first direction X is a direction of arrangement of a pickup part 220, a second direction Y is a direction perpendicular to the first direction when viewed from above, and a third direction Z is a vertical direction perpendicular to a plane defined by the first and second directions X and Y.

Referring to FIGS. 1 and 2, the driving member 100 may adjust the position of the picker 200. Specifically, the driving member 100 may adjust the position of the picker 200 on a plane. For example, the driving member 100 may be provided to adjust the position of a portion connected with the picker 200 in the first or second directions X or Y. In addition, the driving member 100 may adjust the height of the picker 200, e.g., the driving member 100 may allow a portion coupled to the picker 200 to move up/down in the Z direction.

The picker 200 may include a body 210 and at least one pickup part 220. The picker 200 may pick up a plurality of semiconductor devices in an arranged state. The picker 200, i.e., the body 210 of the picker 200, may be detached from the driving member 100 by the detachable unit 300. The configuration of the detachable unit 300 will be described later.

The body 210 provides a frame of the picker 200. The body 210 may be provided with a three-dimensional shape having a certain volume. For example, the overall shape of the body 210 may be a cube having a certain length in the first direction X and a certain width in the second direction Y. The body 210 may be detached from the driving member 100. The body 210 may include coupling protrusions 211 and coupling grooves 212 in a surface facing the driving member 100, as illustrated in FIG. 2, so the coupling protrusions 211 and coupling grooves 212 of the body 210 may be coupled to corresponding coupling grooves 102 and coupling protrusions 101 in the driving member 100.

In detail, the coupling protrusions 101 and 211 and coupling grooves 102 and 212 that are formed on facing surfaces of the body 210 and the driving member 100, respectively, contact each other. For example, one coupling protrusion 211 and one coupling groove 212 may be provided on an upper surface 210a of the body 210. Also, one coupling groove 102 and one coupling protrusion 101 may be respectively formed on a lower surface 100a of the driving member 100 that correspond to the coupling protrusion 211 and the coupling groove 212 of the body 210. Therefore, when the coupling protrusion 211 and the coupling groove 212 formed on the body 210 are coupled to the coupling protrusion 102 and the coupling groove 101 formed on the driving member 100, the body 210 may be coupled to a predetermined position on the driving member 100. As another example, the coupling protrusions 101 and 211 may be formed on one of the body 210 and the driving member 100, and the coupling grooves 102 and 212 may be formed on the other.

The pickup part 220 may be arranged on a lower surface 210b of the body 210 that is opposite the upper surface 210a with the coupling protrusion and groove 211 and 212. The pick up part 220 may pick up semiconductor devices, e.g., may pick up each semiconductor device. For example, a plurality of pickup parts 220 may be spaced apart from each other along the first direction X, and may be arranged on the lower surface 210b of the body 210 along the first direction X to pick up semiconductor devices by way of vacuum adsorption.

Figure 3:
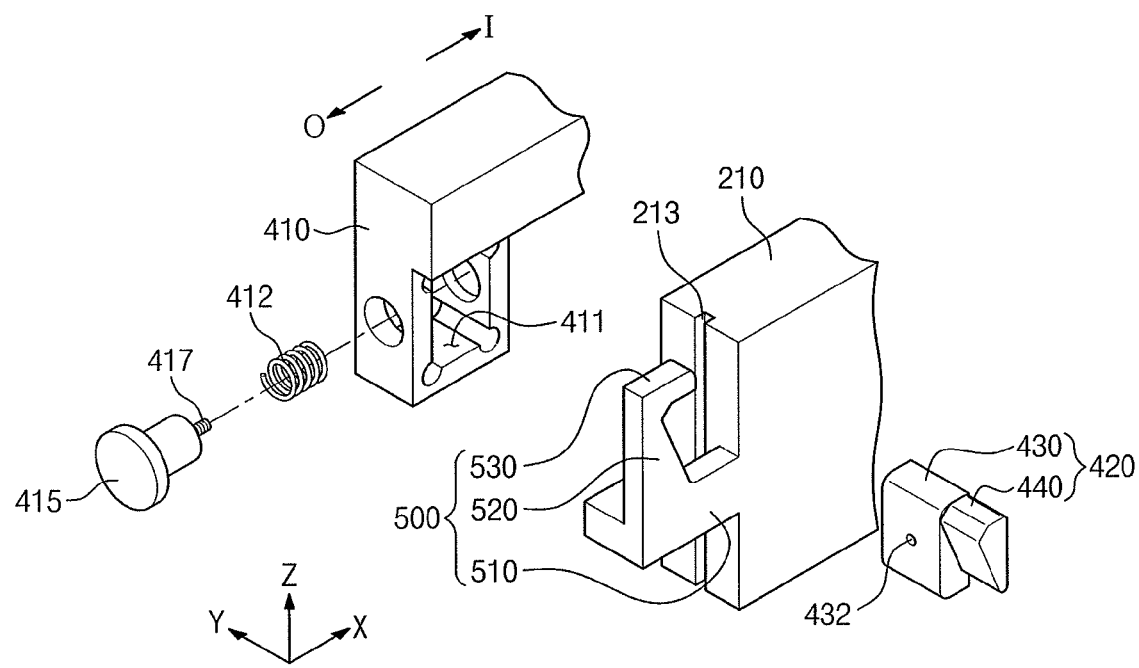
FIG. 3 illustrates an exploded perspective view of a first fixing member of the picker assembly in FIG. 1.
Figure 4:
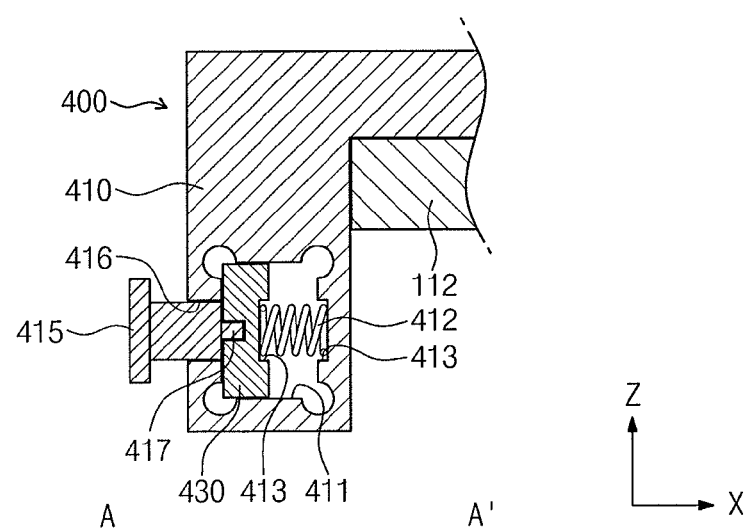
FIG. 4 illustrates a cross sectional view along line A-A in FIG. 2.

The detachable unit 300 may include first fixing members 400 and second fixing members 500 to further couple the picker 200 and the driving member 100 to each other, as will be explained in more detail below with reference to FIGS. 3-4. FIG. 3 is an exploded perspective view of the first fixing member 400, and FIG. 4 is a cross sectional view of the first fixing member 400 along line A-A in FIG. 2

Referring to FIGS. 1-2, a first fixing member 400 may be at an edge of the driving member 100. For example, one first fixing member 400 may be at each edge of the driving member 100, so a distance between two outermost edges of the first fixing members 400 along the first X direction defines a length of the driving member 100 along the first X direction. As illustrated in FIG. 3, each of the first fixing members 400 may include a fixing body 410 and a latch member 420.

As illustrated in FIG. 2, each of the fixing bodies 410 is disposed on the lower surface 100a of the driving member 100 to be adjacent to a portion where the driving member 100 and the picker 200 are connected to each other. The fixing bodies 410 are spaced from each other in the first direction X. The spacing distance between the fixing bodies 410 along the first X direction corresponds to the length of the picker 200 in the first direction X. Therefore, the picker 200 may be fixed to the driving member 100 by being inserted between the fixing bodies 410.

As further illustrated in FIG. 2, each fixing body 410 is coupled to the lower surface 100a of the driving member 100. For example, the fixing body 410 may extend downward from the lower surface 100a of the driving member 100, or extend forward or backward. Further, a guide rib 418 is formed along the third direction Z on an external surface of the fixing body 410 that contacts an external surface of the body 210. Also, a guide groove 213 is formed along the third direction Z on a portion of the external surface of the body 210 that corresponds to the guide rib 418. In other words, when the picker 200 and driving member 100 are coupled to each other, the guide rib 418 on the first fixing member 400 of the driving member 100 is inserted through, e.g., slides into, the guide groove 213 on the body 210 of the picker 200.

Referring to FIGS. 3 and 4, the latch member 420 is coupled to the fixing body 410 to be movable along the first direction X. The latch member 420 includes an insertion part 430 and a protruding part 440.

The insertion part 430 is disposed in an accommodating part 411 formed within the fixing body 410, and may be movable along the first direction X within the accommodating part 411. The accommodating part 411 may be provided as a groove or an opening inside the fixing body 410, and may define an empty volumetric space, e.g., formed along the second direction Y. Top and bottom surfaces spaced along the third direction Z of the accommodating part 411 may be formed as parallel horizontal planes. The insertion part 430 may be shaped as a plate having a certain thickness, and the width of the insertion part 430 in the third direction Z may correspond to the width of the accommodating part 411 in the third direction Z. The thickness of the insertion part 430 in the first direction X is smaller than the width of the accommodating part 411 in the first direction X, so the insertion part 430 may move along the first direction X when disposed in the accommodating part 411. The insertion part 430 may be inserted into the accommodating part 411 along the second direction Y.

Hereinafter, an inside I is where the first fixing members 400 are facing each other, and the side opposite to the inside I is an outside O.

The insertion part 430 may be provided to receive force in a direction at which a second fixing member 500 is disposed. For example, the accommodating part 411 may include an elastic member 412 disposed between the insertion part 430 and a portion of the fixing body 410 (as viewed along the first direction X) to be disposed inside with reference to the insertion part 430. Also, as illustrated in FIG. 4, a first end of the elastic member 412 may be disposed in a first fixing groove 413 formed on the fixing body 410, and a second end of the elastic member 412 may be fixedly disposed in a second fixing groove 431 formed in the insertion part 430.

As illustrated in FIGS. 3-4, an operating part 415 may be disposed on a side of the insertion part 430 that is opposite a direction at which the elastic member is disposed. That is, as illustrated in FIG. 4, the insertion part 430 may be inserted into the fixing body 410 to be positioned between the operating part 415 and the elastic member 412. An operating hole 416, which is formed in the fixing body 410 to allow communication between an outer side of the fixing body 410 and the accommodating part 411, is formed along the first direction X. The operating hole 416 is on a side of the fixing body 410 that is opposite a side of the fixing body 410 with the first fixing groove 413 contacting the elastic member 412. As illustrated in FIG. 4, the operating part 415, e.g., a rod shaped part, is coupled to the insertion part 430 through the operating hole 416.

For example, as illustrated in FIG. 3, a screw thread 417 may be formed on an outer circumferential surface at a first end of the operating part 415, and a groove 432 corresponding thereto may be formed in the insertion part 430 so as to couple the operating part 415 to the insertion part 430. In another example, the operating part 415 and the insertion part 430 may be integrally formed. A second end of the operating part 415 may be exposed to the outside of the operating hole 416, so that force may be applied to the second end of the operating part 415 along the first X direction, thereby moving the insertion part 430 toward the elastic member 412 along the first direction X.

Referring back to FIG. 3, the protruding part 440 of the latch member 420 extends in the second direction Y from a surface of the insertion part 430. The protruding part 440 is exposed to the outside of the accommodating part 411. The protruding part 440 may be formed such that a side surface thereof in the outside O direction slants progressively toward the inside I direction from top to bottom thereof. For example, as illustrated in FIG. 1, the protruding part 440 protrudes out of the detachable member 300 when the picker assembly is assembled.

As further illustrated in FIG. 3, a second fixing member 500 may include a connection part 510, an extension part 520, and a latch part 530. The second fixing member 500 is hook-shaped and is coupled to the first fixing member 400 through latching and fixing.

The connection part 510 is connected to the picker 200. For example, the connection part 510 extends from an external surface of the body 210 of the picker 200. A top surface of the connection part 510 may be shaped to correspond to a bottom surface of the fixing body 410, e.g., the connection part 510 may have a L-shaped cross-section in the YZ plane. Therefore, when the picker 200 is coupled to the driving member 100, the top surface of the connection part 510 may support a portion or the whole of the bottom surface of the fixing body 410.

The extension part 520 extends upward from the, e.g., top surface of the, connection part 510. The extension part 520 is disposed to be adjacent to the protruding part 440 along the first X direction when the picker 200 and the driving member 100 are coupled. For example, as shown in FIG. 1, the protruding part 440 extends out of the second fixing member 500, such that the protruding part 440 is above the connection part 510 and adjacent the extension part 520.

As further illustrated in FIG. 3, a rear surface of the extension part 520 is arranged to face a front surface of the fixing body 410 from which the protruding part 440 protrudes (when assembled). Therefore, when the picker 200 is coupled to the driving member 100, the rear surface of the extension part 520 may contact, e.g., be attached to, the front surface of the fixing body 410.

An inside I external surface of the extension part 520 may be formed to contact an outside O surface of the protruding part 440 when the latch member 420 is moved to the outside O. That is, as illustrated in FIG. 3, a surface of the extension part 520 facing the inside I direction (along the first X direction) may face and contact a surface of the insertion part 430 facing the outside O direction (along the first X direction), when the latch member 420 is inserted through the second fixing member 500. Also, the inside I external surface of the extension part 520 may be formed to progressively slant toward the inside I direction from top to bottom to correspond to an outside O external shape of the protruding part 440. For example, as illustrated in FIG. 3, a surface of the extension part 520 facing the protruding part 440 and a surface of the protruding part 440 facing the extension part 520 may have complementary slanted shapes. Therefore, when the picker 200 is coupled to the driving member 100, the inside I external surface of the extension part 520 may be closely attached to the outside O external surface of the protruding part 440.

As further illustrated in FIG. 3, the latch part 530 extends from an end portion of the extension part 520 toward, e.g., above, the latch member 420. A height from the latch part 530 to the connection part 510 along extension part 520 may correspond to the height of the protruding part 440 in the third direction Z. Therefore, when the picker 200 and the driving member 100 are coupled, the latch part 530 is supported by a top surface of the protruding part 440. A bottom surface of the latch part 530 may be shaped to correspond to a top surface of the protruding part 440 so that the bottom surface of the latch part 530 and the top surface of the protruding part 440 may be closely attached to each other.

Figure 5:
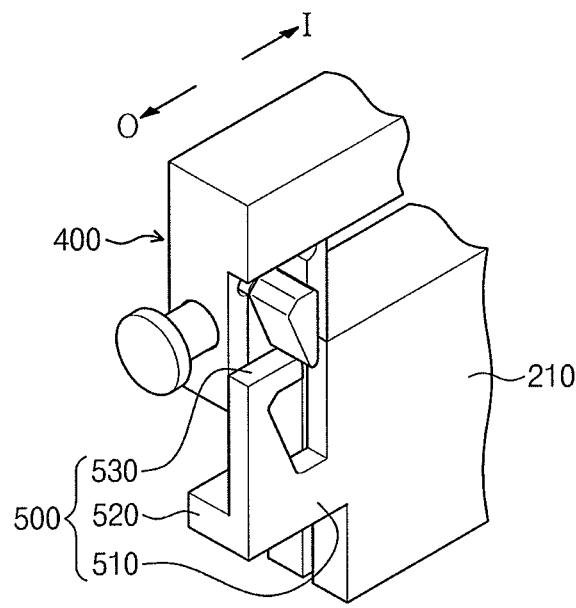
FIG. 5 illustrates a perspective view of a second fixing member coupled to a first fixing member of the picker assembly in FIG. 1.

FIG. 5 is a view illustrating a state in which the second fixing member 500 is coupled to the first fixing member 400. Referring to FIG. 5, the picker 200 may be coupled to the driving member 100 by a simple pushing operation.

In detail, an operator may hold the picker 200, and may dispose the picker to be arranged under the driving member 100 (FIG. 2). At this time, the coupling protrusions 101 and 211 and the coupling grooves 102 and 212 may help to check the arranged state, e.g., alignment, of the picker 200. Then, the operator may lift the picker 200 upward toward the driving member 100, such that the guide rib 418 of the driving member 100 is inserted into the guide groove 213 of the picker 200. Once the guide rib 418 is inserted into the guide groove 213, this configuration assists the movement of the picker 200 upward, i.e., so sliding of the guide rib 418 inside the guide groove 213 continues. The picker 200 is lifted upward until the latch part 530 contacts a bottom of the outside O external surface of the protruding part 440 (FIG. 5). Then, the latch part 530 presses against and moves along the outside O external surface of the protruding part 440, such that the latch member 420 is at the inside I direction relative to the latch part 530. When the picker 200 is lifted up to a coupling height, a bottom surface of the latch part 530 is supported by transferring the latch member 420 in the outside O direction to complete the coupling of the picker 200 (FIG. 1).

Figure 6:
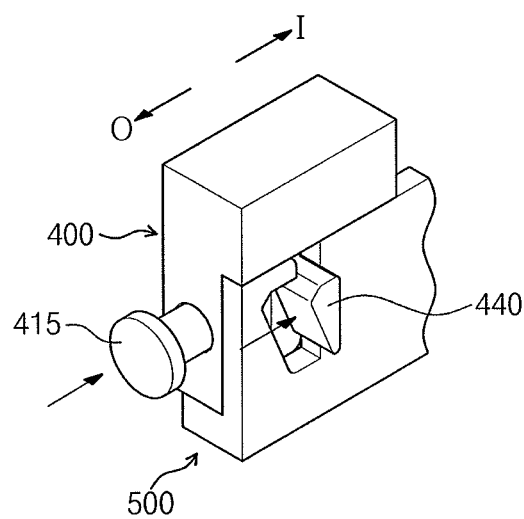
FIG. 6 illustrates a perspective view of a second fixing member separated from a first fixing member.

FIG. 6 is a view illustrating a state in which the second fixing member 500 is separated from the first fixing member 400. Referring to FIG. 6, the picker 200 may be separated from the driving member 100 by moving the latch member 420 in the inside I direction.

In detail, an operator may hold the picker 200 with one hand, and may push the operating part 415 with the other, so as to move the latch member 420 in the inside I direction. When the protruding part 440 is spaced from a bottom surface of the latch part 530 due to the movement of the latch member 420, the operator may move the picker 200 downward to separate it from the driving member 100.

In another embodiment, the detachable unit 300 may be provided in a manner in which the first fixing members 400 are disposed on the picker 200 and the second fixing members 500 are disposed on the driving member 100. In another embodiment, the guide groove 213 may be provided on the first fixing member 400, while the guide rib 418 may be formed on the picker 200.

Figure 7:
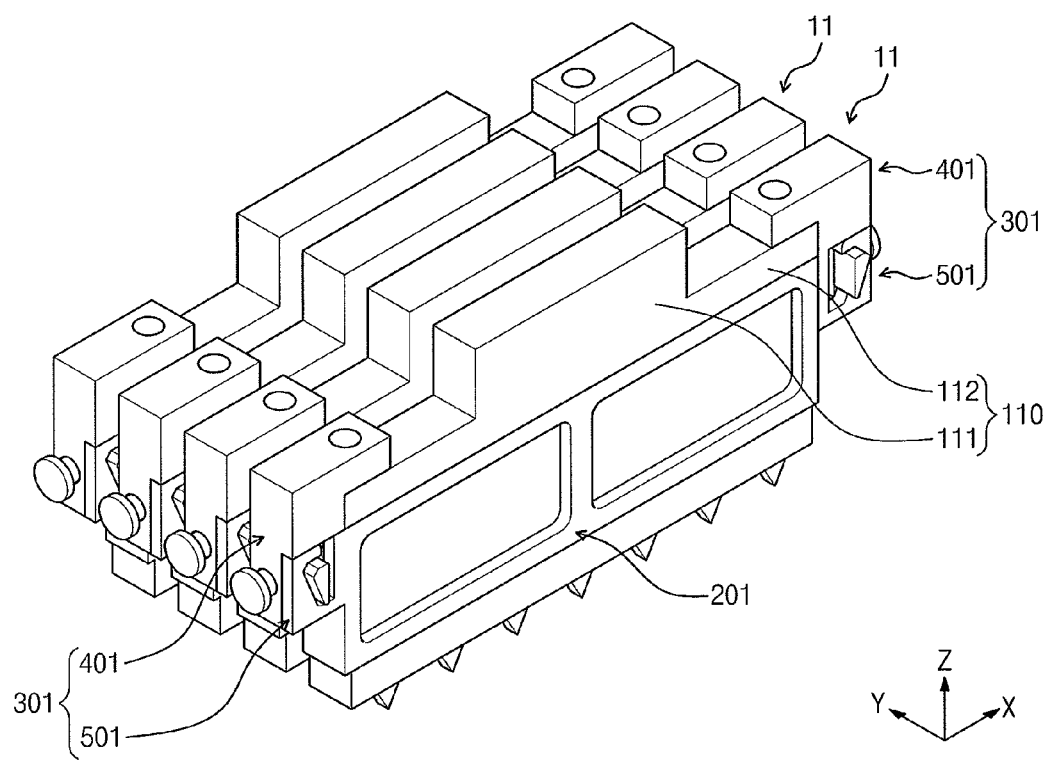
FIG. 7 illustrates a perspective view of a picker assembly according to another embodiment.
Figure 8:
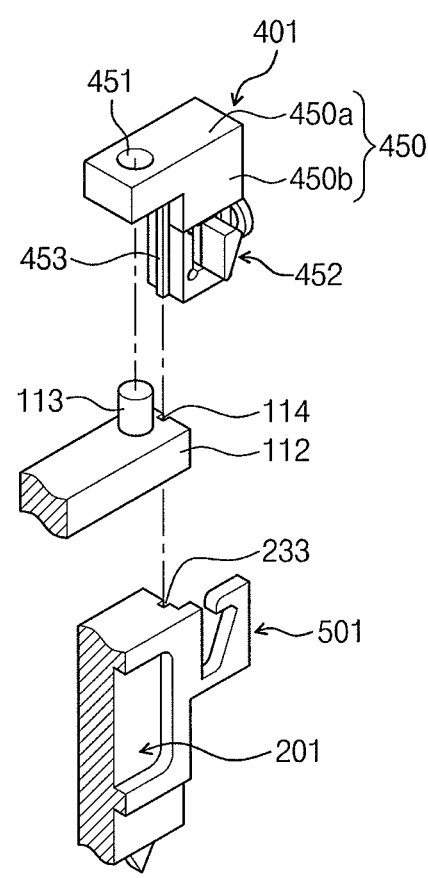
FIG. 8 illustrates a perspective view of a driving member, a picker, and a first fixing member that are separated from each other.

FIG. 7 is a perspective view according to another embodiment, and the FIG. 8 is a perspective view illustrating a state in which a driving member, a picker, and a first fixing member of FIG. 7 are separated.

Referring to FIGS. 7 and 8, a picker assembly 11 may include a driving member 110, a picker 201, and a detachable unit 301. Also, a plurality of picker assemblies 11 may be used at the same time. For example, the plurality of picker assemblies 11 may be arranged in parallel. A spacing distance between adjacent one of the plurality of picker assemblies 11 may be adjusted. For example, the plurality of picker assemblies 11 may be simultaneously driven to pick up semiconductor devices. For example, only some of the plurality of picker assemblies 11 may pick up semiconductor devices.

The driving member 110 may include a driving part 111 and a connection part 112. The driving part 111 may adjust the position of a picker 201, and may be the same or similar to the driving part 100 of the picker assembly 10 in FIG. 1. The connection part 112 may protrude from the driving part 111 along the first X direction, i.e., a connection part 112 may protrude from each end of the driving part 111 toward the first direction X. A distance between two opposite and outermost edges of the two connection parts 112 may correspond to a width of the picker 201 in the first direction X. A guide groove 114 (FIG. 8) is formed on an external surface of each of the connection parts 112 along the third direction Z, and one or more supporting protrusions 113 are provided on a top surface of each of the connection parts 112.

The picker 201 may pick up a plurality of semiconductor devices in an arranged state. The picker 201 may be the same or similar to the picker 200 of the picker assembly 10 in FIG. 1. A guide groove 233 which is the same or similar to the guide groove of the picker 200 in FIG. 1 may be formed on an external surface of the picker 201. The guide groove 233 formed on the picker 201 may be arranged with the guide groove 114 formed on the connection part 112, such that one is above, e.g., and aligned with, the other.

The detachable unit 301 may include first fixing members 401 and second fixing members 501.

The first fixing members 401 are detachable. As illustrated in FIG. 8, the first fixing members 401 include a supporting part 450*a* and a fixing part 450*b*.

The supporting part 450a extends in one direction. For example, the supporting part 450a may have a shape of a cube or a rod. An insertion part 451 is formed on a bottom surface of the supporting part 450a to correspond to a supporting protrusion 113 on the connection part 112 of the driving member 110. The insertion part 451 may be formed as a groove or a hole in which the supporting protrusion 113 may be inserted. A bottom surface of the supporting part 450a may correspond to a top surface of the connection part 112. Accordingly, when the supporting protrusion 113 is inserted into the insertion part 451, the supporting part 450a may be supported in a closely attached state to the connection part 112. The fixing part 450b extends downward from one side of a bottom surface of the supporting part 450a. Some external surfaces of the fixing part 450b contact some external surfaces of the connection part 112 when the first fixing member 401 is coupled to the driving member 110.

A guide rib 453 to be inserted into the guide groove 114 is provided on a portion corresponding to the guide groove 114 along the third direction Z. A latch member 452 provided to the fixing part 450b may be the same or similar to the latch member 420 provided to the first fixing member 400 in FIG. 1. Second fixing members 501 may be the same or similar to the second fixing members 500 included in the picker assembly 10 in FIG. 1.

Hereinafter, a process in which the picker 201 and the driving member 110 are coupled will be explained.

First, an operator arranges the guide rib 453 above the guide groove 114 of the connection part 112, and then moves the first fixing member 401 downward. The guide rib 453 is configured to guide the movement of the first fixing member 401 after being inserted into the guide groove 114. When the supporting protrusion 113 is inserted into the insertion part 451 according to the movement of the first fixing member 401, the coupling of the first fixing member 401 is completed.

Then, the operator arranges the guide groove 233 of the picker 201 with the guide rib 453, and then moves the picker 201 upward. The guide groove 233 is configured to guide the movement of the picker 201 after being inserted into the guide rib 453. When the second fixing member 501 is coupled to the latch member 452 according to a continuous rising of the picker 201, the coupling of the picker 201 is completed.

Also, the operator may couple the picker 201 to the driving member 110 by closely attaching the picker 201 to the driving member 110 and moving the first fixing member 401 downward.

An operator may simply detach a picker according to an embodiment.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A picker assembly, comprising:
   a picker;
   a driving member coupled to the picker, the driving member adjusting a position of the picker;
   a pair of first fixing members on a lower surface of the driving member, the pair of first fixing members being adjacent to a portion at which the driving member and the picker are connected, and each of the first fixing members including a latch member movable linearly along a longitudinal direction of the driving member; and
   a pair of second fixing members on the picker, the pair of second fixing members being coupled to respective first fixing members through latching and fixing.

2. The picker assembly as claimed in claim 1, wherein each of the first fixing members includes:
   a fixing body on the lower surface of the driving member; and
   the latch member coupled to the fixing body, the latch member being movable linearly within the fixing member along the longitudinal direction of the driving member.

3. The picker assembly as claimed in claim 2, wherein:
   the fixing body includes an accommodation part with an opening therein, and
   the latch member includes:
      an insertion part accommodated in the accommodation part, and
      a protruding part extending from the insertion part to an outside of the accommodation part, the protruding part being exposed to the outside of the accommodation part.

4. The picker assembly as claimed in claim 3, wherein the second fixing members are latched onto the protruding parts of the respective first fixing members.

5. The picker assembly as claimed in claim 3, further comprising an elastic member in the accommodation part, the elastic member being between the insertion part and the fixing body.

6. The picker assembly as claimed in claim 5, further comprising an operation hole through the fixing body, the insertion part being coupled to an operation part having a rod shape and extending through the operation hole.

7. The picker assembly as claimed in claim 2, wherein:
   the fixing body has a guide rib on an external surface thereof at a portion that contacts the picker, and
   the picker has a guide groove corresponding to the guide rib, the guide groove being on an external surface thereof.

8. The picker assembly as claimed in claim 7, wherein the guide rib and the guide groove extend along vertical directions.

9. The picker assembly as claimed in claim 1, further comprising:
   a coupling protrusion on a surface of one of the picker and the driving member; and
   an insertion groove on a surface of another of the picker and the driving member, the coupling protrusions being inserted into the insertion groove.

10. A picker assembly, comprising:
    a picker;
    a driving member coupled to the picker, the driving member adjusting a position of the picker;
    a pair of first fixing members on one of the driving member and the picker, the pair of first fixing members being adjacent to a portion at which the driving member and the picker are connected, and each of the first fixing members including a latch member movable linearly along a longitudinal direction of the driving member; and a pair of second fixing members on the other of the picker and the driving member, the pair of second fixing members being coupled to the pair of first fixing members through latching and fixing.

11. The picker assembly as claimed in claim 10, wherein each of the first fixing members includes:
   a fixing body; and
   the latch member coupled to the fixing body to be movable linearly within the fixing member, the latch member having an oblong shape along an imaginary line connecting the picker with the driving member.

12. The picker assembly as claimed in claim 11, wherein the latch member receives force in a direction oriented toward the second fixing member.

13. The picker assembly as claimed in claim 11, wherein:
   the fixing body includes an accommodation part having an opening therein, and
   the latch member includes:
      an insertion part accommodated in the accommodation part, and
      a protruding part extending from the insertion part and exposed to an outside of the accommodation part.

14. The picker assembly as claimed in claim 10, wherein each of the second fixing members has a latch shape.

15. The picker assembly as claimed in claim 14, wherein the second fixing member has a latch part at an end portion thereof to protrude in a direction of the latch member.

16. A picker assembly, comprising:
   a picker;
   a driving member coupled to the picker, the driving member adjusting a position of the picker;
   first fixing members on the driving member, each of the first fixing members including a latch member movable linearly along a longitudinal direction of the driving member; and
   second fixing members on the picker, each of the second fixing members including a hook-shaped portion latched onto the latch member of a respective first fixing member.

17. The picker assembly as claimed in claim 16, wherein each of the first fixing members includes:
   a fixing body on the driving member; and
   the latch member extending from the fixing body to be exposed to an exterior of the fixing body, the latch member being movable linearly within the fixing member.

18. The picker assembly as claimed in claim 17, wherein the hook-shaped portion of the second fixing member is latched onto the latch member of the first fixing member.

19. The picker assembly as claimed in claim 18, wherein the hook-shaped portion of the second fixing member includes:
   a first portion extending horizontally from a side surface of the picker;
   a second portion extending vertically from the first portion toward the driving member; and
   a third portion extending from the second portion and curving around a top of the latch member of the first fixing member.

20. The picker assembly as claimed in claim 19, wherein the second portion of the second fixing member has a slanted surface facing the latch member of the first fixing member, and the latch member has a slanted surface facing the slanted surface of the second portion of the second fixing member, the two slanted surfaces being complementary.

* * * * *